(12) United States Patent
Szymanowski et al.

(10) Patent No.: US 11,159,134 B2
(45) Date of Patent: Oct. 26, 2021

(54) MULTIPLE-STAGE POWER AMPLIFIERS AND AMPLIFIER ARRAYS CONFIGURED TO OPERATE USING THE SAME OUTPUT BIAS VOLTAGE

(71) Applicant: NXP USA, Inc., Austin, TX (US)

(72) Inventors: Margaret A. Szymanowski, Chandler, AZ (US); Monte Gene Miller, Gilbert, AZ (US)

(*) Notice: Subject to any disclaimer, the term of this patent is extended or adjusted under 35 U.S.C. 154(b) by 60 days.

(21) Appl. No.: 16/720,728

(22) Filed: Dec. 19, 2019

(65) Prior Publication Data
US 2021/0194440 A1 Jun. 24, 2021

(51) Int. Cl.
*H03F 3/68* (2006.01)
*H03F 3/195* (2006.01)
*H03F 1/02* (2006.01)
*H03F 1/56* (2006.01)
*H03F 3/193* (2006.01)
*H03F 3/21* (2006.01)

(52) U.S. Cl.
CPC ........... *H03F 3/195* (2013.01); *H03F 1/0288* (2013.01); *H03F 1/565* (2013.01); *H03F 3/193* (2013.01); *H03F 3/211* (2013.01)

(58) Field of Classification Search
CPC ............................... H03F 1/0288; H03F 3/68
USPC .................................................. 330/295, 311
See application file for complete search history.

(56) References Cited

U.S. PATENT DOCUMENTS

| 5,111,157 A * | 5/1992 | Komiak ................ H03F 3/604 330/286 |
| 10,250,197 B1 | 4/2019 | Schultz et al. |
| 2010/0301944 A1* | 12/2010 | Yamamoto .......... H01L 27/0605 330/277 |
| 2012/0268213 A1* | 10/2012 | Actis ....................... H03F 3/195 330/295 |
| 2014/0218116 A1 | 8/2014 | Cui et al. |
| 2014/0232467 A1 | 8/2014 | Mukai et al. |
| 2016/0254787 A1* | 9/2016 | Lee ........................ H03F 1/3247 330/96 |
| 2018/0254253 A1 | 9/2018 | Zhang et al. |
| 2018/0367104 A1* | 12/2018 | Seebacher ............... H01L 24/48 |

FOREIGN PATENT DOCUMENTS

| EP | 0481741 A2 | 4/1992 |
| WO | WO-2020/060851 A1 | 3/2020 |

* cited by examiner

*Primary Examiner* — Steven J Mottola (57) ABSTRACT

A multiple-stage amplifier includes a driver stage transistor characterized by a first power density, and a final stage transistor characterized by a second power density that is larger than the first power density. A first drain bias circuit is coupled to a first drain terminal of the driver stage transistor, and is configured to provide a first drain bias voltage to the first drain terminal. A second drain bias circuit is coupled to a second drain terminal of the final stage transistor, and is configured to provide a second drain bias voltage to the second drain terminal, where the second drain bias voltage equals the first drain bias voltage. An interstage impedance matching circuit is coupled between the first drain terminal and a gate terminal of the final stage transistor. The multiple-stage amplifier may be included in a Doherty power amplifier, a transceiver, and/or a transceiver array.

22 Claims, 6 Drawing Sheets

MULTIPLE-STAGE POWER AMPLIFIERS AND AMPLIFIER ARRAYS CONFIGURED TO OPERATE USING THE SAME OUTPUT BIAS VOLTAGE

TECHNICAL FIELD

Embodiments of the subject matter described herein relate generally to multiple-stage power amplifiers.

BACKGROUND

A massive MIMO (multiple-input, multiple-output) base station provides two-way, multiplexed communications to a plurality of wireless devices (i.e., user equipment) within a cell that is serviced by the base station. A typical base station includes a remote radio unit (or remote radio head) connected to an array of antenna elements (e.g., tens to hundreds of antennas) that are configured to communicate over the air interface with the wireless devices. The remote radio unit includes a transceiver front end with an array of transceivers, where each transceiver is coupled to one of the antennas in the antenna array (i.e., there is a 1:1 correlation between transceivers and antenna elements). For example, a typical massive MIMO transceiver array may include anywhere from 64 transceivers (e.g., in an 8×8 array, also referred to as an 8T or 8T8R array) up to 4096 transceivers (e.g., in a 64×64 transceiver array, also referred to as a 64T or 64T64R array), although smaller and larger antenna and transceiver arrays have been contemplated, as well. Given the complexity inherent in such large numbers of transceivers in a massive MIMO transceiver array, system designers continuously strive to achieve high performance systems that meet increasingly stringent size and power consumption requirements.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

An embodiment of a multiple-stage amplifier includes a driver stage transistor characterized by a first power density, and a final stage transistor characterized by a second power density that is larger than the first power density. A first drain bias circuit is coupled to a first drain terminal of the driver stage transistor, and is configured to provide a first drain bias voltage to the first drain terminal. A second drain bias circuit is coupled to a second drain terminal of the final stage transistor, and is configured to provide a second drain bias voltage to the second drain terminal, where the second drain bias voltage equals the first drain bias voltage. An interstage impedance matching circuit is coupled between the first drain terminal and a gate terminal of the final stage transistor.

According to a further embodiment, a ratio of the first power density of the driver stage transistor to the second power density of the final stage transistor is in a range of 1:2 to 1:8. According to another further embodiment, the driver stage transistor a silicon-based semiconductor field effect transistor, and the final stage transistor a III-V-based semiconductor field effect transistor. According to yet another further embodiment, the driver stage transistor is a laterally-diffused metal oxide semiconductor field effect transistor, and the first power density is in a range of about 1.0 watts/millimeter (W/mm) to about 3.0 W/mm, and the final stage transistor is a gallium nitride based high electron mobility transistor, and the second power density is in a range of about 5.0 W/mm to about 15.0 W/mm. According to yet another further embodiment, the first and second drain bias voltages are in a range of 30 volts to 60 volts. According to yet another further embodiment, the driver stage transistor and the first drain bias circuit are integrally formed in a first semiconductor die, the final stage transistor is integrally formed in a second semiconductor die, and the interstage impedance matching circuit includes a connector between the first and second semiconductor dies. According to yet another further embodiment, a final stage gate bias circuit is coupled to the second gate terminal and is integrally formed in the second semiconductor die, and a decoupling capacitor is coupled between the first drain bias circuit and the final stage gate bias circuit.

An embodiment of a Doherty power amplifier includes first and second amplification paths. The first amplification path includes a first driver stage transistor with a first gate terminal and a first drain terminal, a first drain bias circuit coupled to the first drain terminal of the first driver stage transistor, and configured to provide a first drain bias voltage to the first drain terminal, a first final stage transistor with a second gate terminal and a second drain terminal, and a second drain bias circuit coupled to the second drain terminal of the first final stage transistor, and configured to provide a second drain bias voltage to the second drain terminal. The second amplification path includes a second driver stage transistor with a third gate terminal and a third drain terminal, a third drain bias circuit coupled to the third drain terminal of the second driver stage transistor, and configured to provide a third drain bias voltage to the third drain terminal, a second final stage transistor with a fourth gate terminal and a fourth drain terminal, and a fourth drain bias circuit coupled to the fourth drain terminal of the second final stage transistor, and configured to provide a fourth drain bias voltage to the fourth drain terminal. The first, second, third, and fourth drain bias voltages are equal. The first and second driver stage transistors are characterized by a first power density, and the first and second final stage transistors are characterized by a second power density that is larger than the first power density.

According to a further embodiment, a ratio of the first power density to the second power density is in a range of 1:2 to 1:8. According to another further embodiment, the first and second driver stage transistors are silicon-based semiconductor field effect transistors, and the first and second final stage transistors are III-V-based semiconductor field effect transistors. According to yet another further embodiment, the Doherty power amplifier also includes a power splitter with an input terminal and first and second output terminals, where the first output terminal is electrically coupled to the first gate terminal, the second output terminal is electrically coupled to the third gate terminal, and the power splitter is configured to receive an input RF signal at the input terminal of the power splitter, and to split power of the input RF signal into first and second RF signals that are produced at the first and second output terminals of the power splitter.

An embodiment of a transceiver array includes a transceiver array substrate, and first and second transceivers coupled to the transceiver array substrate. The first transceiver has a first multiple-stage amplifier with a first driver stage transistor with a first drain terminal, a first final stage transistor with a second drain terminal, and first bias circuitry coupled to the first and second drain terminals. The second transceiver has a second multiple-stage amplifier with a second driver stage transistor with a third drain terminal, a second final stage transistor with a fourth drain terminal, and second bias circuitry coupled to the third and fourth drain terminals. The transceiver array also includes a network of interconnected bias supply lines coupled to the transceiver array substrate, and electrically connected to the first and second bias circuitry to facilitate providing a single drain bias voltage to the first, second, third, and fourth drain terminal.

According to a further embodiment, the transceiver array also includes a DC drain bias voltage source coupled to the network of interconnected bias supply lines, and configured to provide the single drain bias voltage. According to another further embodiment, the first multiple-stage amplifier forms a portion of a first Doherty power amplifier, and the second multiple-stage amplifier forms a portion of a second Doherty power amplifier. According to yet another further embodiment, the first and second driver stage transistors are characterized by a first power density, and the first and second final stage transistors are characterized by a second power density that is larger than the first power density. According to yet another further embodiment, a ratio of the first power density to the second power density is in a range of 1:2 to 1:8. According to yet another further embodiment, the first and second driver stage transistors are laterally-diffused metal oxide semiconductor field effect transistors, and the first power density is in a range of about 1.0 watts/millimeter (W/mm) to about 3.0 W/mm, and the first and second final stage transistors are gallium nitride based high electron mobility transistors, and the second power density is in a range of about 5.0 W/mm to about 15.0 W/mm. According to yet another further embodiment, the first and second driver stage transistors are silicon-based semiconductor field effect transistors, and the first and second final stage transistors are III-V-based semiconductor field effect transistors.

Figure 1:
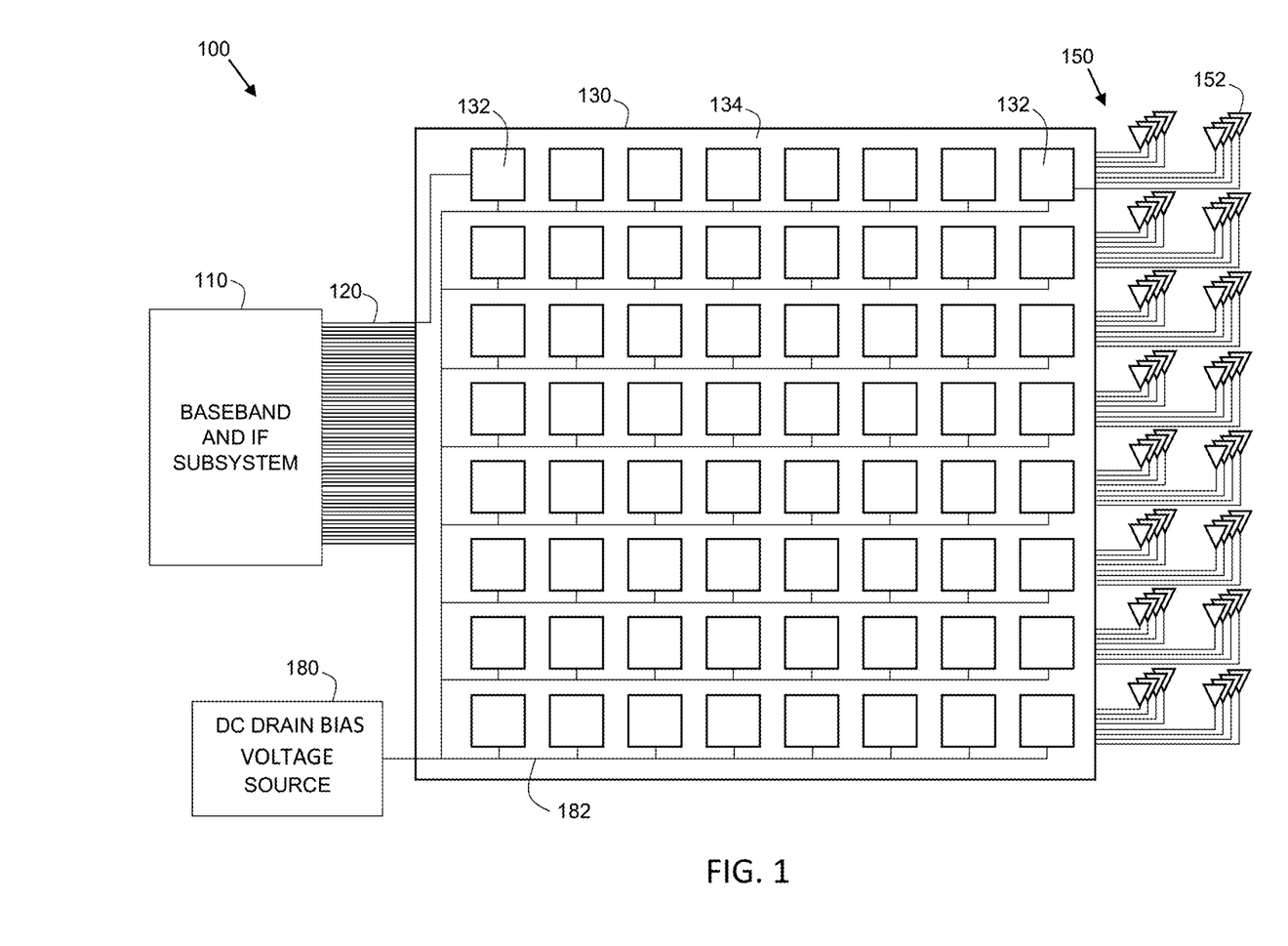
FIG. 1 is a simplified diagram of a portion of a massive MIMO system with an 8T transceiver array, in accordance with an embodiment.

FIG. 1 is a simplified diagram of a portion of a massive MIMO system 100 with an 8T transceiver array, in accordance with an embodiment. System 100 includes a baseband and intermediate frequency (IF) subsystem 110, a transceiver array 130, and an antenna array 150. System 100 may be implemented, for example, in a cellular base station, although system 100 alternatively may be implemented in another type of wireless system other than a base station, as well.

The baseband and IF subsystem 110 is configured to perform baseband and IF processing on a plurality of signals for transmission ("TX signals," herein), and to provide those signals over a plurality of conductors 120 to the transceiver array 130. In addition, the baseband and IF subsystem 110 is configured to receive and process a plurality of signals ("RX signals," herein) from the transceiver array 130 via the plurality of conductors 120. For example, the plurality of conductors 120 may include a plurality of coaxial cables or other conductors.

The transceiver array 130 includes a plurality of identical transceivers 132, which may be arranged in a plurality of rows and a plurality of columns in the transceiver array 130. In some embodiments, all of the transceivers 132 in the array 130 may be coupled to a common transceiver array substrate 134 (e.g., a multiple-layer printed circuit board (PCB) or other type of substrate), which includes a plurality of transceiver sockets into which the transceivers 132 are inserted, or a plurality of transceiver mounting areas to which the transceivers 132 are coupled (e.g., soldered). In the illustrated embodiment, the transceiver array 130 includes 8 rows and 8 columns of transceivers 132, for a total of 64 transceivers 132 in the array 130. In other embodiments, the number of rows and/or columns of transceivers may be smaller or larger, and/or the number of rows may be different from the number of columns. In still other embodiments, sub-arrays of the transceivers 132 may be coupled to distinct transceiver substrates. To avoid cluttering FIG. 1, only one connection between a connector 120 and a transceiver 132 is shown in the upper left corner of the transceiver array 130. Those of skill in the art would understand, based on the description herein, that the transceiver array 130 may include a dedicated connection between each connector 120 and each transceiver 132.

The transceiver array 130 is electrically coupled to antenna array 150, which includes a plurality of antennas 152. According to an embodiment, the system 100 is a time division duplex (TDD) system, and each antenna 152 is configured both to transmit radio frequency (RF) signals over the air interface ("RF TX signals," herein), and also to receive RF signals from the air interface ("RF RX signals," herein). In such an embodiment, each transceiver 132 in the transceiver array 130 is coupled to a different one of the antennas 152 in the antenna array 150 (i.e., there is a 1:1 correlation between the number of transceivers 132 and the number of antennas 152). To avoid cluttering FIG. 1, only one connection between a transceiver 132 and an antenna 152 is shown in the upper right corner of the transceiver array 130. Those of skill in the art would understand, based on the description herein, that the transceiver array 130 may include a dedicated connection between each transceiver 132 and each antenna 152.

As will be described in more detail in conjunction with FIG. 2, later, each transceiver 132 includes a transmitter (e.g., transmitter 240, FIG. 2), a receiver (e.g., receiver 260, FIG. 2), and a transmit/receive (TX/RX) switch (e.g., TX/RX switch 270, FIG. 2). As will be explained in more detail in conjunction with FIG. 4, later, the transmitter of each transceiver 132 includes one or more multiple-stage amplifiers (e.g., multiple-stage amplifier 400, FIG. 4), where each multiple-stage amplifier includes a driver stage amplifier (e.g., driver stage amplifier 410, FIG. 4) coupled in series with a final stage amplifier (e.g., final stage amplifier 470, FIG. 4). For example, both the driver stage amplifier and the power stage amplifier may be implemented using a field effect transistor (FET). In a particular embodiment, the driver stage amplifier FET and the final stage amplifier FET have significantly different power densities, and may be implemented using different semiconductor technologies on distinct semiconductor dies (e.g., dies 610, 670, FIG. 6). For example, the driver stage FET may be a silicon-based FET, and the final stage FET may be a III-V semiconductor-based FET.

Each amplification stage of each multiple-stage amplifier receives one or more DC bias voltages from one or more external voltage sources. According to a particular embodiment, the driver stage amplifier FET and the final stage amplifier FET of each transceiver 132 receive a same output (e.g., drain) DC bias voltage ("output/drain bias voltage," herein), even though the driver and final stage amplifier FETs have significantly different power densities and may be implemented using different semiconductor technologies. According to a further embodiment, the output/drain bias voltage for the driver and final stage amplifier FETs of all transceivers 132 in the transceiver array 130 may be provided by a single, external DC drain bias voltage source 180 through a network of interconnected bias supply lines 182 that are coupled to the transceiver array substrate 134. For example, the DC drain bias voltage source 180 may be configured to provide an output/drain bias voltage in a range of about 20 volts (V) to about 60 V (e.g., an output/drain bias voltage of about 48 V), although the output/drain bias voltage may be lower or higher, as well. Although not illustrated in FIG. 1, additional DC bias and other voltages also may be supplied to the transceivers 132 in the transceiver array 130, including, for example, one or more input (e.g., gate) DC bias voltages ("input/gate bias voltage," herein) for each transmitter's driver stage amplifier FET and final stage amplifier FET. To avoid cluttering FIG. 1, those additional DC voltage sources and bias/supply lines are not illustrated.

Figure 2:
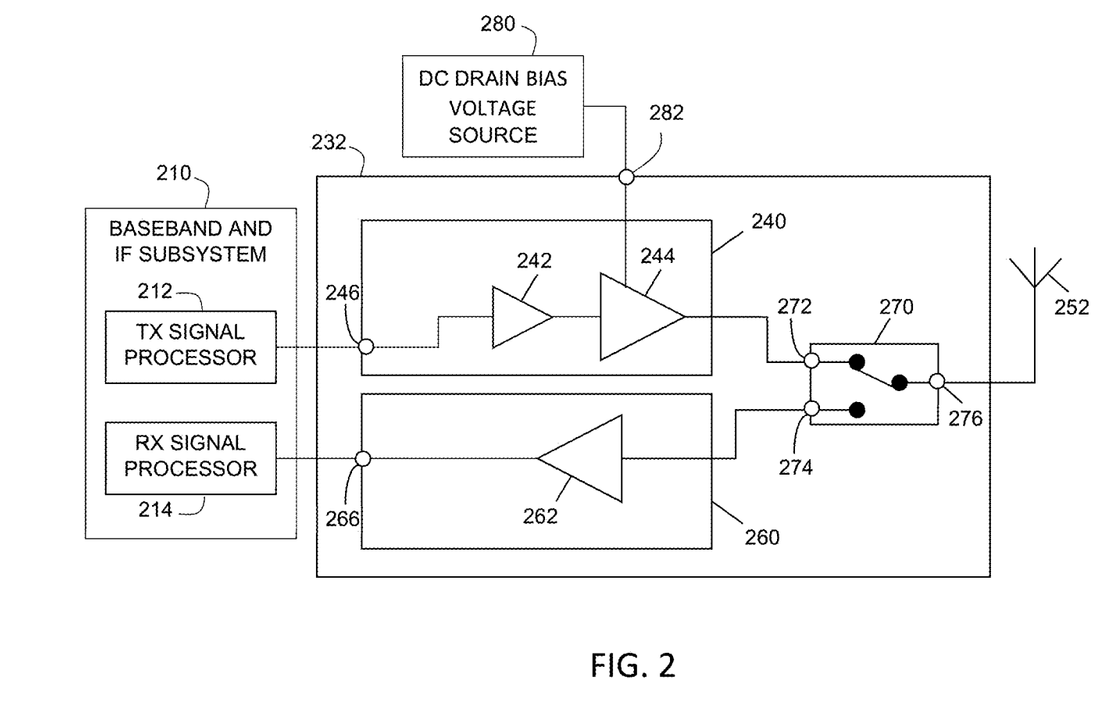
FIG. 2 is a simplified block diagram of a transceiver suitable for use in a massive MIMO transceiver array, in accordance with an embodiment.

FIG. 2 is a simplified block diagram of a transceiver 200 (e.g., transceiver 132, FIG. 1) suitable for use in a massive MIMO transceiver array (e.g., transceiver array 130, FIG. 1), in accordance with an embodiment. Transceiver 232 includes a transmitter 240, a receiver 260, and a TX/RX switch 270. The transmitter 240 and the receiver 260 each are coupled between a baseband and IF subsystem 210 (e.g., system 110, FIG. 1) and an antenna 252 (e.g., one of antennas 152, FIG. 1). The baseband and IF subsystem 210 includes a transmit (TX) signal processor 212 and a receive (RX) signal processor 214, which are coupled to the input 246 of transmitter 240 and the output 266 of receiver 260, respectively.

Transceiver system 200 is a half-duplex transceiver configured to support TDD communications. Accordingly, only one of the transmitter 240 or the receiver 260 are coupled, through the TX/RX switch 270, to the antenna 252 at any given time. More specifically, the state of the TX/RX switch 270 is controlled (e.g., by switch controller 350, FIG. 3) to alternate between a transmit state in which the switch 270 couples an RF TX signal produced by the transmitter 240 to the antenna 252, or a receive state in which the switch 270 couples an RF RX signal received by the antenna 252 to the receiver 260.

The transmit signal processor 212 is configured to produce transmit signals, and to provide the transmit signals through input 246 to the transmitter 240. For example, the transmitter 240 may include a pre-amplifier 242 and a power amplifier 244. The pre-amplifier 242 modestly amplifies the transmit signal provided by the transmit signal processor 212. The power amplifier 244 further amplifies the transmit signal, and provides the amplified TX RF signal to the TX/RX switch 270. As will be described in more detail later, the power amplifier 244 includes a multiple-stage amplifier with a driver stage amplifier FET and a final stage amplifier FET, which receive a same output/drain bias voltage. For example, the output/drain bias voltage may be supplied by DC drain bias voltage source 280 (e.g., DC drain bias voltage source 180, FIG. 1), which is connected to the power amplifier 244 (and more particularly to the outputs of the driver and final stage amplifier FETs within the power amplifier 244) through DC bias input 282. When transceiver 232 is included within a transceiver array, such as transceiver array 130, FIG. 1, the DC bias input 282 may be connected, for example, to the previously-discussed network of interconnected bias supply lines 182 that are coupled to the transceiver array substrate 134.

The receiver 260 may include, for example, a receive amplifier 262 (e.g., a low noise amplifier). The receive amplifier 262 is configured to amplify relatively low power RF RX signal received from the TX/RX switch 270, and to provide the amplified received signal to the receive signal processor 214 through output 266. The receive signal processor 214 is configured to consume or process the receive signals.

During each transmit time interval, the TX/RX switch 270 is controlled to be in a first or "transmit" state, as depicted in FIG. 2, in which a transmit signal path is closed between transmitter node 272 and antenna node 276, and in which a receive signal path is open between antenna node 276 and receiver node 274. Conversely, during each receive time interval, the TX/RX switch 270 is controlled to be in a second or "receive" state, in which the receive signal path is closed between antenna node 276 and receiver node 274, and in which the transmit signal path is open between transmitter node 272 and antenna node 276.

As will be described in more detail in conjunction with FIG. 3, below, the RF transceiver 232 may be physically implemented using a variety of active and passive ICs, modules, and electrical components. For example, the various components of the RF transceiver 232 may be implemented in a self-contained module or packaged electrical device, which may be coupled to a transceiver substrate (e.g., transceiver substrate 134, FIG. 1) along with a plurality of other transceiver modules or devices. As used herein, the term "transceiver device" means a set of active and/or passive electrical devices (e.g., ICs, modules, and electrical components) that together constitute a transceiver (e.g., transceiver 132, 232, FIGS. 1, 2), and that are physically contained within a single housing (e.g., a device package) or that are physically coupled to a common substrate (e.g., a PCB). A "transceiver device" also includes a plurality of conductive terminals for electrically connecting the set of devices to external circuitry that forms other portions of an electrical system (e.g., baseband and IF subsystem 110, 210, bias voltage source 180, 280, and antennas 152, 252, FIGS. 1, 2). For example, in various embodiments, a transceiver device may be in the form of a PCB-based module, a surface mount module, a chip carrier device, a ball, pin, or land grid array device, a flat package (e.g., a quad or dual flat package) device, a chip scale packaged device, a system-in-package (SiP) device, or in the form of some other type of integrated circuit package. Although a particular type of transceiver device is described below, it is to be understood that embodiments of the inventive subject matter may be included in other types of transceiver devices, as well.

Figure 3:
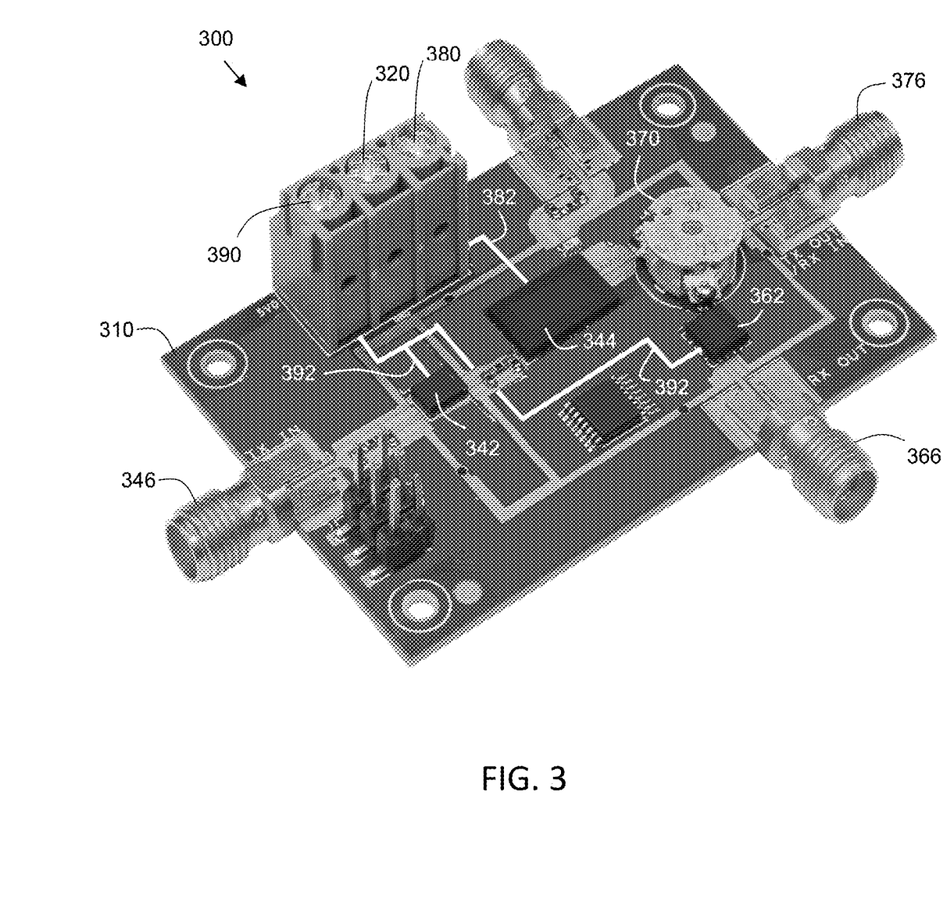
FIG. 3 is a top view of a transceiver module that embodies the transceiver of FIG. 2, in accordance with an embodiment.

For example, FIG. 3 is a top view of a transceiver device 300 (e.g. an instance of a transceiver 132, FIG. 1) that embodies the RF transceiver 232 of FIG. 2, in accordance with an embodiment. Device 300 is implemented as a PCB-based module, in accordance with the illustrated example embodiment, although device 300 may be packaged in other types of packages or modules, as well (e.g., a quad-flat no-leads (QFN) device, or another type of device). In any event, device 300 includes a substrate 310, which may include, for example, a plastic substrate, a single- or multi-layer PCB, a conductive flange, and/or another rigid structure.

Device 300 also includes a plurality of components coupled to the substrate 310, including a transmit pre-amplifier module 342 (e.g., embodying pre-amplifier 242, FIG. 2), a transmit amplifier module 344 (e.g., embodying transmit amplifier 244, FIG. 2), a receive amplifier module 362 (e.g., embodying receive amplifier 262, FIG. 2), and a TX/RX switch module or duplexer 370 (e.g., embodying TX/RX switch 270, FIG. 2). In addition, device 300 also includes a plurality of connectors (or terminals or leads), which are configured to provide electrical connectivity between electrical systems external to device 300 and the transceiver components housed by the device 300. For example, the connectors (or leads or terminals) may include one or more ground connectors 320, a transmit signal input connector 346 (e.g., transmitter input 246, FIG. 2), a receive signal output connector 366 (e.g., receiver output 266, FIG. 2), an antenna/load connector 376 (e.g., antenna terminal 254, FIG. 2), a first DC bias voltage connector 380 (e.g., DC bias input 282, FIG. 2), and one or more additional power and/or DC bias voltage connectors 390. The various modules 342, 344, 362, 370 and connectors 320, 346, 366, 376, 380, 390 are electrically connected together through a plurality of conductive electrical features (e.g., including conductive traces 382, 392 and other conductive features). In other embodiments, various ones of the modules 342, 344, 362, 370 and connectors 320, 346, 366, 376, 380, 390 may be electrically connected together using other conductive structures. In various embodiments, the device 300 may contained within an air cavity or overmolded (e.g., encapsulated), although the device 300 may be considered to be complete without such containment, as well.

After incorporation of device 300 into a transceiver array (e.g., transceiver array 130, FIG. 1), and during operation of the transceiver system, bias and ground reference voltages may be provided to device 300 through bias and ground terminals 320, 380, 390. As mentioned above, and as will be described in more detail in conjunction with FIGS. 4-6, for example, the amplifier module 344 includes at least one multiple-stage amplifier with a driver stage amplifier FET and a final stage amplifier FET, which are configured to receive a same output/drain DC bias voltage through bias voltage connector 380 and conductive trace 382, which may be coupled to an external DC drain bias voltage source (e.g., DC drain bias voltage source 180, 280, FIGS. 1, 2). The transmit pre-amplifier module 342 and/or the receive amplifier module 362 may receive one or more other bias and/or operational DC voltages through voltage connector 390 and conductive traces 392, which may be coupled to another external DC voltage source (not illustrated).

The TX/RX duplexer 370 may operate in a transmit state or a receive state at any given time. When the TX/RX duplexer 370 is operating the transmit state, transmit signals received through the transmit signal input connector 346 and amplified by the pre-amplifier and power amplifier modules 342, 344 are passed through the TX/RX duplexer 370 to the antenna connector 376. Conversely, when the TX/RX duplexer 370 is operating in the receive state, signals received from the antenna connector 376 are passed through the TX/RX duplexer 370 to the receive amplifier module 362, which amplifies the received signals and provides the amplified received signals to the receive signal output connector 366.

Figure 4:
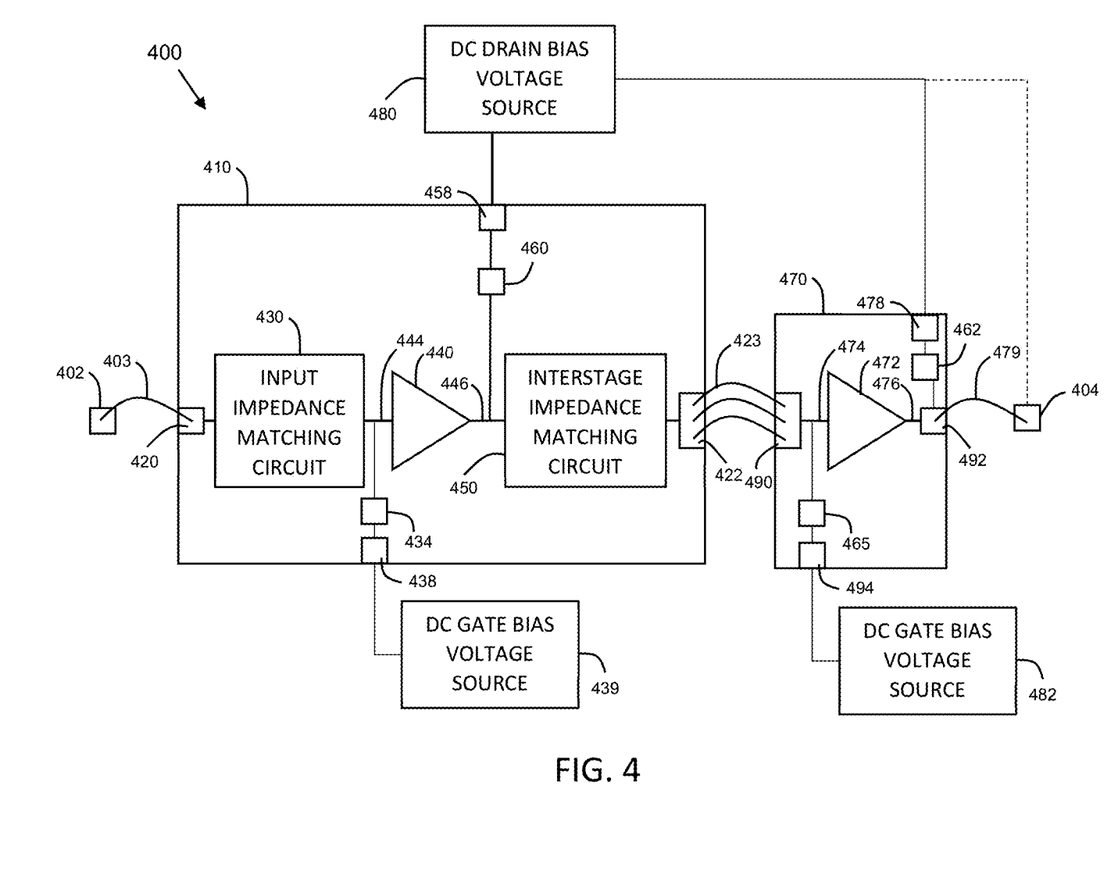
FIG. 4 is a simplified block diagram of a two-stage power amplifier, in accordance with an example embodiment.
Figure 5:
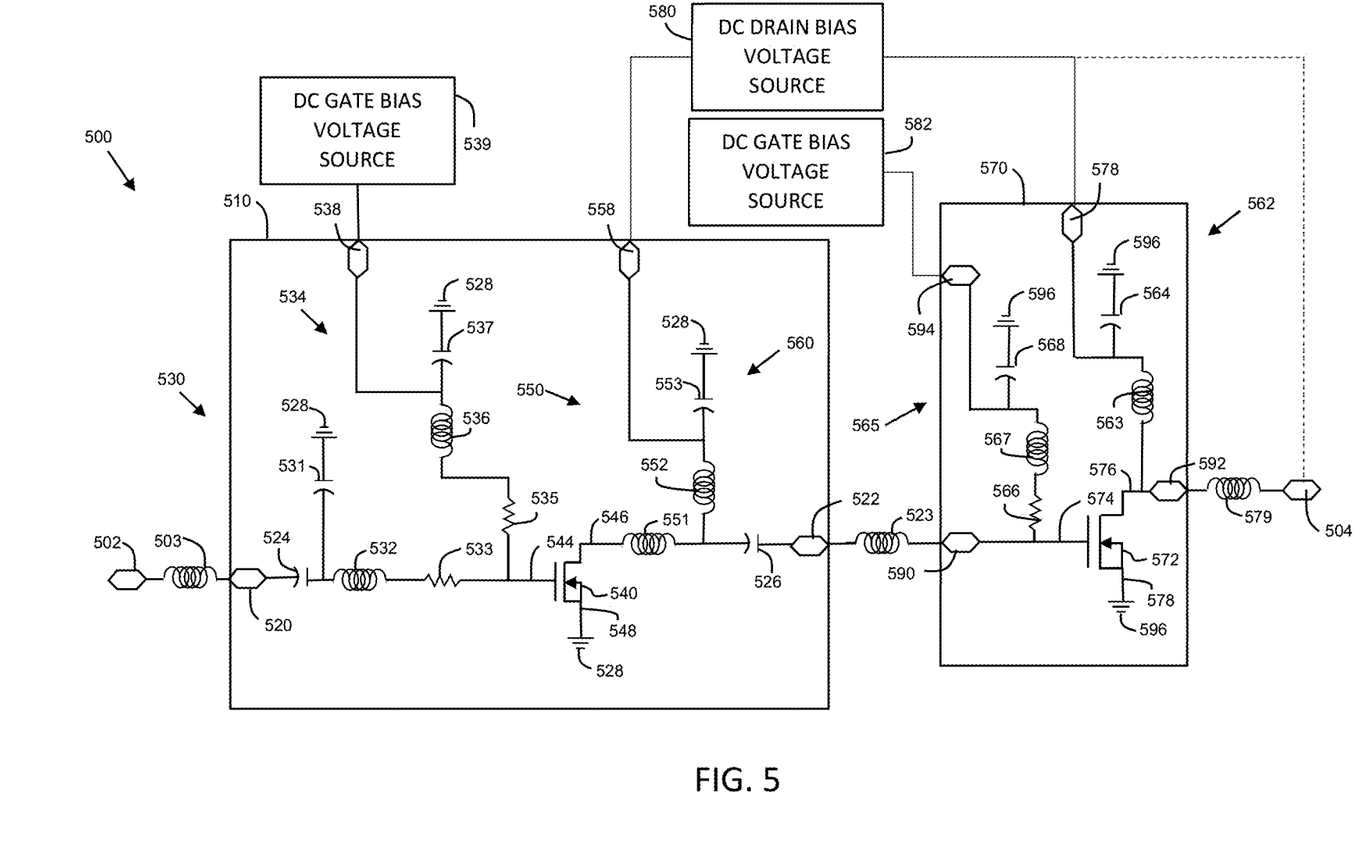
FIG. 5 is a circuit diagram of an embodiment of a two-stage, cascade amplifier, in accordance with an example embodiment.

As discussed previously, the transmit power amplifier (e.g., amplifier 244 or amplifier module 344, FIGS. 2, 3) includes at least one multiple-stage amplifier. FIGS. 4 and 5 illustrate a simplified block diagram of a multiple-stage amplifier 400, and a circuit diagram of a multiple-stage amplifier 500, respectively, which may be included within a transmit amplifier or module (e.g., amplifier 244 or module 344, FIGS. 2, 3) and/or a transceiver (e.g., transceiver 132, 232, FIGS. 1, 2), in accordance with various embodiments.

Briefly, each of the multiple-stage amplifiers 400, 500 in FIGS. 4 and 5 include a driver stage amplifier 410, 510 coupled in series with a final stage amplifier 470, 570. According to an embodiment, both the driver stage amplifier 410, 510 and the final stage amplifier 470, 570 include a field effect transistor (FET) 440, 472, 540, 572, although the power densities between the driver stage amplifier 410, 510 and the final stage amplifier 470, 570 are significantly different. In a particular embodiment, the driver stage amplifier FET 440, 540 and the final stage amplifier FET 472, 574 are implemented using different semiconductor technologies on distinct semiconductor dies. For example, the driver stage FET may be a silicon-based FET, and the final stage FET may be a III-V semiconductor-based FET. In alternate embodiments, either the driver stage FET or the final stage FET may be implemented using technologies other than silicon or GaN, or the driver stage FET and the final stage FET may be implemented using the same semiconductor technology, as long as the power density of the two devices is significantly different.

According to a particular embodiment, the driver stage amplifier FET 440, 540 and the final stage amplifier FET 472, 572 each receive a same output/drain DC bias voltage from a DC drain bias voltage source 480, 580 (e.g., DC drain bias voltage source 180, 280, FIGS. 1, 2), even though the driver and final stage amplifier FETs 440, 472, 540, 572 have different power densities and may be implemented using different semiconductor technologies. For example, the DC drain bias voltage source 480, 580 may be configured to provide an output/drain bias voltage in a range of about 20 V to about 60 V (e.g., an output/drain bias voltage of about 48 V), although the output/drain bias voltage may be lower or higher, as well.

Referring first to FIG. 4, a simplified block diagram of a two-stage amplifier 400 is illustrated, which includes a driver stage IC die 410 and a final stage IC die 470 electrically coupled together in a cascade arrangement between an RF signal input terminal 402 and an RF signal output terminal 404, in accordance with an example embodiment. The essential components of the two-stage amplifier 400 include a series-coupled combination of a driver stage transistor 440 in the driver stage IC die 410, an interstage impedance matching circuit 450, and a final stage transistor 472 in the final stage IC die 470.

The driver stage IC die 410 includes an input terminal 420, an output terminal 422, an input impedance matching circuit 430, and the driver stage transistor 440. According to an embodiment, the driver stage IC die 410 also includes an integrated portion of the interstage impedance matching circuit 450 electrically coupled between the driver stage transistor 440 and the output terminal 422 of the driver stage IC die 410. The final stage IC die 470 includes an input terminal 490, an output terminal 492, and a final stage transistor 472, in an embodiment. An inductive connection 423 (e.g., wirebonds) is electrically coupled between the output terminal 422 of the driver stage IC die 410 and the input terminal 490 of the final stage IC die 470.

In the embodiments illustrated in FIGS. 4 and 5, the interstage impedance matching circuit 450 includes a plurality of components that are integrally formed in the driver stage IC die 410 (referred to as an "integrated portion" of the interstage impedance matching circuit 450), along with an inductive connection 423 between the driver and final stage dies 410, 470. In other embodiments, all of portions of the interstage impedance matching circuit 450 may be implemented separately from the driver stage IC die 410. For example, the components of the interstage impedance matching circuit 450 may be implemented using a separate integrated passive device (IPD) positioned between the driver and final stage dies 410, 470, along with inductive connections (e.g., wirebonds) from the driver stage die 410 to the IPD, and from the IPD to the final stage die 470. In still other embodiments, the interstage impedance matching circuit 457 may include an inductive connection (e.g., wirebonds) between the driver stage IC die 410 and the final stage IC die 470, along with a plurality of components that are integrally formed in the final stage IC die 470. Although only the illustrated embodiment is described in detail, below, the various alternate embodiments mentioned above are intended to be included in the scope of the inventive subject matter.

Along a forward amplification path, the RF signal input terminal 402 is electrically coupled to the input terminal 420 of the driver stage IC die 410 through connection 403 (e.g., a wirebond, wirebond array, or other electrical connection), the input terminal 420 is coupled to the input impedance matching circuit 430, the input impedance matching circuit 430 is coupled to an input 444 (e.g., gate or control terminal) of the driver stage transistor 440, an output 446 (e.g., a drain or first current-conducting terminal) of the driver stage transistor 440 is coupled to the integrated portion of the interstage impedance matching circuit 450, and the integrated portion of the interstate impedance matching circuit 450 is coupled to the output terminal 422.

The output terminal 422 of driver stage die 410 is electrically coupled through a connection 423 (e.g., a wirebond array or other conductive connection) to the input terminal 490 of the final stage IC die 470. The connection 423 represents a non-integrated portion of the interstage matching circuit between the output (e.g., drain terminal) of the driver stage transistor 440 and the input (e.g., gate terminal) of the final stage transistor 472. Continuing along the forward amplification path, the input terminal 490 of the final stage IC die 470 is coupled to an input 474 (e.g., gate or control terminal) of the final stage transistor 472, and an output 476 (e.g., drain or first current-conducting terminal) of the final stage transistor 472 is coupled to the output terminal 492. The output terminal 492 is electrically coupled through connection 479 (e.g., a wirebond array or other electrical connection) to the RF signal output terminal 404.

During operation, an RF signal received through the RF signal input terminal 402 and the driver stage die input terminal 420 is conveyed through the input impedance matching circuit 430, which is configured to raise the impedance of the amplifier 400 to a higher impedance level (e.g., 50 Ohms or another impedance level) to enhance gain flatness and power transfer across the frequency band. The resulting RF signal is then amplified by the driver stage transistor 440 (i.e., the driver stage transistor 440 functions as a driver amplifier, which applies a first gain to the RF signal). For example, the driver stage transistor 440 may apply a gain in a range of about 40 decibels (dB) to about 55 dB to the RF signal (e.g., about 50 dB, in some embodiments), although the gain applied by the driver stage transistor 440 may be lower or higher, as well.

The amplified RF signal produced at the output 446 of the driver stage transistor 440 is then conveyed through the integrated portion of the interstage impedance matching circuit 450. The resulting RF signal produced at output terminal 422 is then conveyed through the connection 423 to the input terminal 490 of the final stage IC die 470. The integrated portion of the interstage impedance matching circuit 450 and the connection 423 between the die 410, 470 together are configured to match the output impedance (or drain impedance) of the driver stage transistor 440 with the input impedance of the final stage transistor 472 to enhance gain flatness and power transfer across the frequency band. In some embodiments, the connection 423 is a non-integrated, series inductive component in the interstage matching circuit between the output of the driver stage transistor 440 and the input 474 of the final stage transistor 472.

The pre-amplified RF signal received at the input terminal 490 of the final stage IC die 470 is amplified by the final stage transistor 472 (i.e., the final stage transistor 472 functions as a final amplifier, which applies a second gain to the RF signal). For example, the final stage transistor 472 may apply a gain in a range of about 40 dB to about 45 dB to the RF signal (e.g., about 44 dB, in some embodiments), yielding a total gain through the device 400 in a range of about 50 dB to about 40 dB (e.g., about 65 dB, in some embodiments), although the gain applied by the final stage transistor 472 and/or the total device gain may be lower or higher, as well. The amplified RF signal produced at the output 476 of the final stage transistor 472 is then conveyed through the output terminal 492 and the connection 479 to the RF signal output terminal 404.

According to a specific embodiment, the power transistor 440 includes a silicon laterally-diffused, metal oxide semiconductor (LDMOS) field effect transistor, which has a power density in a range of about 1.0 watts/millimeter (W/mm) to about 3.0 W/mm (e.g., about 2.0 W/mm). Further, according to a specific embodiment, the power transistor 472 includes a GaN-based high electron mobility transistor (HEMT), which has a power density in a range of about 5.0 W/mm to about 15.0 W/mm (e.g., about 10.0 W/mm) and an input impedance in a range of about 1.0 ohms to about 5.0 ohms (e.g., about 1.4 ohms), although the input impedance could be smaller or larger, as well. Although either power transistor 440 or power transistor 472 could be implemented using a semiconductor technology other than silicon LDMOS or GaN HEMT, respectively (including using the same semiconductor technology), an important aspect of the present invention is that the power densities of the driver stage transistor 440 and the final stage transistor 472 are significantly different. More particularly, the power density of the driver stage transistor 440 is significantly lower than the power density of the final stage transistor 472 (or conversely, the power density of the final stage transistor 472 is significantly higher than the power density of the driver stage transistor 440). According to an embodiment, a ratio of the power density of the driver stage transistor 440 to the power density of the final stage transistor 472 is in a range of 1:2 to 1:8 (e.g., 1:5). For example, the power density ratio would be 1:5 when the driver stage transistor 440 has a power density of 2.0 W/mm and the final stage transistor has a power density of 10.0 W/mm.

According to another specific embodiment, both power transistors 440, 472 are configured to have an output impedance and a breakdown voltage that is appropriate to support operation using the same drain bias voltage. For example, the driver stage transistor 440 may have a real portion of an output impedance in a range of about 50 ohms to about 100 ohms (e.g., about 75 ohms), and the final stage transistor 472 may have a real portion of an output impedance in a range of about 1.0 ohms to about 5.0 ohms (e.g., about 1.4 ohms). As will be discussed in more detail later, the interstage impedance matching circuit 450 (including connection 423) is configured to provide an impedance transformation between the output impedance of the driver stage transistor 440 and the input impedance of the final stage transistor 472.

Biasing of the driver and final stage IC dies 410, 470 will now be described. According to an embodiment, the driver stage IC die 410 further includes an integrated bias circuit 460 (or "driver stage drain bias circuit"), which is configured to convey a bias voltage to the output 446 (e.g., the drain terminal) of the driver stage transistor 440. More specifically, the driver stage IC die 410 includes a bias circuit input terminal 458 (referred to simply as "bias input terminal"), and the bias voltage control circuit 460 electrically coupled between the bias input terminal 458 and the output terminal 446 of the driver stage transistor 440.

Similarly, the final stage IC die 470 further includes an integrated bias circuit 462 (or "final stage drain bias circuit"), which is configured to convey a bias voltage to the output 476 (e.g., the drain terminal) of the final stage transistor 472. More specifically, the final stage IC die 470 includes a bias input terminal 478, and the integrated bias circuit 462 electrically coupled between the bias input terminal 478 and the output terminal 476 of the final stage transistor 472.

The integrated bias circuits 460, 462 (and more specifically the bias input terminals 458, 478) are both electrically connected to the DC drain bias voltage source 480 (e.g., DC drain bias voltage source 180, 280, FIGS. 1, 2), in an embodiment, to receive the same output/drain DC bias voltage. In an alternate embodiment, as indicated by the dashed line in FIG. 4, the output/drain DC bias voltage for the final stage transistor 472 may be supplied through output terminal 404, connection 479, and output terminal 492.

In addition to drain bias circuits and a drain bias voltage source (e.g., circuits 460, 462 and voltage source 480), amplifier 400 also may include one or more gate bias circuits 434, 465, which are coupled (e.g., through bias input terminals 438, 494, respectively) to one or more DC gate bias voltage sources 439, 482. For example, DC gate bias voltage source 439 may provide a DC bias voltage through input terminal 438 and driver stage gate bias circuit 434 to the input 444 (e.g., gate terminal) of driver stage transistor 440. For example, the DC gate bias voltage for the driver stage, Vg1, may have a positive value up to about 6.2 V or more (e.g., about 1.5 V). DC gate bias voltage source 482 may provide a DC bias voltage through input terminal 494 and final stage gate bias circuit 465 to the input 474 (e.g., gate terminal) of final stage transistor 472. When the final stage transistor 472 is a depletion-mode, normally-on III-V device, the received and conveyed gate bias voltage for the final stage, Vg2, is a negative DC bias voltage that functions to pinch off the final stage transistor 472. For example, the DC gate bias voltage for the final stage, Vg2, may have a negative value down to about −5.0 V or less (e.g., about −3.5 V).

In contrast, when the final stage transistor 472 is an enhancement-mode, normally-off device, the received and conveyed gate bias voltage is a positive DC bias voltage.

A circuit diagram that includes a depiction of a more specific embodiment of amplifier 400 will now be described in detail in conjunction with FIG. 5. More specifically, FIG. 5 is a circuit diagram of an embodiment of a two-stage, cascade amplifier 500 with a silicon-based driver stage and a GaN-based final stage, in accordance with an example embodiment.

Amplifier 500 includes a silicon driver stage IC die 510 (e.g., IC die 410, FIG. 4) and a GaN final stage IC die 570 (e.g., IC die 470, FIG. 4), which are electrically coupled together in a cascade arrangement between an RF signal input terminal 502 (e.g., input terminal 402, FIG. 4) and an RF signal output terminal 504 (e.g., output terminal 404, FIG. 4). As used herein, the terms "integrated circuit die" and "IC die" mean a single, distinct die within which one or more circuit components (e.g., transistors, passive devices, and so on) are integrated and/or directly physically connected. According to an embodiment, a plurality of circuits, each including an arrangement of passive and/or active electrical components, are integrated within the silicon driver stage IC die 510 and the GaN final stage IC die 570. It should be noted that, although die 510 is described as being a "silicon" die, and die 570 is described as being a "GaN" die, in other embodiments, either or both dies could be formed using different semiconductor materials (e.g., in the case of the GaN die, other III-V semiconductor materials, such as gallium arsenide (GaAs), gallium phosphide (GaP), indium phosphide (InP), indium antimonide (InSb)). Similarly, the transistors 540, 572 within dies 510, 570 may be formed using different semiconductor materials.

The silicon driver stage IC die 510 includes a plurality of circuits integrated within a silicon IC die (e.g., a high-resistivity silicon die). In an embodiment, the integrated circuitry of die 510 includes an input terminal 520 (e.g., input terminal 420, FIG. 4), an output terminal 522 (e.g., output terminal 422, FIG. 4), a first DC blocking/AC decoupling capacitor 524, a second DC blocking/AC decoupling capacitor 526, an input impedance matching circuit 530 (e.g., circuit 430, FIG. 4), a power transistor 540 (e.g., transistor 440, FIG. 4), an integrated portion of an interstage impedance matching circuit 550 (e.g., circuit 450, FIG. 4), a gate bias circuit 534 (e.g., circuit 434, FIG. 4), and a drain bias circuit 560 (e.g., circuit 460, FIG. 4), in an embodiment. As mentioned previously, the integrated portion of the interstage impedance matching circuit 550 alternatively may not be integrated in die 510, but instead may be implemented using circuitry that is distinct from die 510 (e.g., an IPD between die 510 and die 570, or circuitry integrated with die 570).

The power transistor 540 is the primary amplification component of the silicon driver stage IC die 510. In an embodiment, power transistor 540 includes a FET with a gate terminal 544 (control terminal), a drain terminal 546 (first current-conducting terminal), and a source terminal 548 (second current conducting terminal). The source terminal 548 is electrically coupled to a ground node 528 (e.g., the source terminal 548 is electrically coupled to a conductive layer on a bottom surface of the silicon IC die 510 through one or more through substrate vias (TSVs)). According to a specific embodiment, the power transistor 540 includes a silicon LDMOS transistor, which has a power density in a range of about 1.0 W/mm to about 3.0 W/mm (e.g., about 2.0 W/mm). Further, the power transistor 540 has a real portion of an output impedance in a range of about 50 ohms to about 100 ohms (e.g., about 75 ohms), although the input impedance could be smaller or larger, as well.

The RF signal input terminal 502 is electrically coupled to the input terminal 520 of the silicon driver stage IC die 510 with a connection 503 (e.g., a plurality of wirebonds or another electrical connection). The first DC blocking/AC decoupling capacitor 524 has a first terminal electrically coupled to the input terminal 520, and a second terminal electrically coupled to the input impedance matching circuit 530. The first DC blocking/AC decoupling capacitor 524 may provide some impedance transformation, but with a primary functionality of blocking the driver stage gate bias voltage, Vg1, from the input terminal 520.

The input impedance matching circuit 530 is electrically coupled between the second terminal of the DC blocking/AC decoupling capacitor 524 and the gate terminal 544 of the driver stage power transistor 540. The input impedance matching circuit 530 includes the first DC blocking/AC decoupling capacitor 524, a second capacitor 531, a first inductor 532, a first resistor 533, and a shunt circuit that includes a series combination of a second resistor 535, a second inductor 536, and a third capacitor 537. The second capacitor 531 includes a first terminal coupled to the second terminal of the DC blocking/AC decoupling capacitor 524, and a second terminal coupled to the ground node 528. The first inductor 532 includes a first terminal coupled to the second terminal of the DC blocking/AC decoupling capacitor 524 (and to the first terminal of capacitor 531), and a second terminal coupled to the gate terminal 544 of the power transistor 540 through the first resistor 533. The shunt circuit includes the second resistor 535, the second inductor 536, and the third capacitor 537 (e.g., a DC blocking capacitor) electrically coupled between the gate terminal 544 of the power transistor 540 and the ground node 528. In alternate embodiments, the second resistor 535 may be excluded, or the order of the second resistor 535, the second inductor 536, and the third capacitor 537 may be different from the order depicted in FIG. 5.

The input impedance matching circuit 530 functions to raise the impedance of amplifier 500, as previously mentioned, and also functions to impart amplitude and phase distortions on the RF signal that are inverse to the amplitude and phase distortions imparted by the GaN-based final stage transistor 572 of the GaN final stage IC die 570. The input impedance matching circuit 530 may include a low pass circuit, a high pass circuit, a bandpass circuit, or a combination thereof. Generally, the inductance, capacitance, and resistance values will be scaled according to the center frequency of operation of the amplifier 500. Further, although the input impedance matching circuit 530 is shown in FIG. 5 to have a particular configuration, in other embodiments, the input impedance matching circuit 530 may be differently configured, while still performing substantially the same functions.

A gate bias voltage, Vg1, for the power transistor 540 is provided to the gate terminal 544 of the power transistor 540 through the shunt circuit of the input impedance matching circuit 530, in an embodiment. More particularly, the gate bias voltage may be provided through an input terminal 538, which is electrically coupled to a node of the shunt circuit (e.g., a node between the second inductor 536 and the third capacitor 537). For example, the gate bias voltage, Vg1, may be provided by an external voltage source 539, and may have a positive value up to about 6.2 V or more, although the gate bias voltage may be lower or higher, as well. More typically, the gate bias voltage, Vg1, would be less than about 2.0 V (e.g., about 1.5 V).

The interstage impedance matching circuit 550 is electrically coupled between the drain terminal 546 of the power transistor 540, and the gate terminal 574 of transistor 572. An integrated portion of the interstage impedance matching circuit 550 includes a first inductor 551, a shunt circuit, and the second DC blocking/AC decoupling capacitor 526. The first inductor 551 includes a first terminal coupled to the drain terminal 546 of the power transistor 540, and a second terminal coupled to a first terminal of the second DC blocking/AC decoupling capacitor 526. The shunt circuit includes a series combination of a second inductor 552 and a first capacitor 553 (e.g., a DC blocking capacitor) electrically coupled between the second terminal of the first inductor 551 (and the first terminal of the second DC blocking/AC decoupling capacitor 526) and the ground node 528.

The interstage impedance matching circuit 550, coupled with connection 523, function to match the impedance of the drain terminal 546 of power transistor 540 to the gate terminal 574 of transistor 572 for proper power transfer across the frequency band. In addition, the interstage impedance matching circuit 550 functions to shape the input RF waveforms to the GaN final stage IC die 570. According to an embodiment, the interstage impedance matching circuit 550 (including connection 523) is configured to perform an impedance transformation between the output impedance of driver stage transistor 540 and the real portion of the input impedance of final stage transistor 572 in a range of about 50 ohms to about 100 ohms (e.g., about 73.6 ohms when the output impedance of transistor 540 is 75 ohms and the input impedance of transistor 572 is 1.4 ohms), according to an embodiment. The interstage impedance matching circuit 550 (including connection 523) may be configured as a low pass circuit, a high pass circuit, a bandpass circuit, or a combination thereof. In various embodiments:

the first inductor 551 may have an inductance value in a range of about 3 nH to about 5 nH (e.g., about 4 nH for a center operating frequency, $f_0$, of about 3.5 GHz);

the second inductor 552 may have an inductance value in a range of about 1.3 nH to about 2.3 nH (e.g., about 1.86 nH for a center operating frequency, $f_0$, of about 3.5 GHz);

the first capacitor 553 may have a capacitance value in a range of about 15 pF to about 25 pF (e.g., about 20 pF for a center operating frequency, $f_0$, of about 3.5 GHz); and the DC blocking/AC decoupling capacitor 526 may have a capacitance value in a range of about 3.4 pF to about 4.4 pF (e.g., about 3.9 pF for a center operating frequency, $f_0$, of about 3.5 GHz).

The inductance, capacitance, and resistance values may be lower or higher, in various embodiments. Generally, the inductance, capacitance, and resistance values will be scaled according to the center frequency of operation of the amplifier 500. Further, although the interstage impedance matching circuit 550 is shown in FIG. 5 to have a particular configuration, in other embodiments, the interstage impedance matching circuit 550 may be differently configured, while still performing substantially the same functions.

The second DC blocking/AC decoupling capacitor 526 may provide some impedance transformation, but with a primary functionality of blocking a drain bias voltage, Vd1, for the driver stage power transistor 540 from a gate bias voltage, Vg2, for the final stage power transistor 572 of the GaN final stage IC die 570.

The drain bias voltage, Vd1, for the power transistor 540 is provided to the drain terminal 546 of the power transistor 540 through the shunt circuit of the interstage impedance matching circuit 550, in an embodiment. In other words, the shunt circuit functions as the driver stage drain bias circuit 560 (e.g., circuit 460, FIG. 4). More particularly, the drain bias voltage may be provided through an input terminal 558, which is electrically coupled to a node of the shunt circuit (e.g., a node between the second inductor 552 and capacitor 553). For example, the drain bias voltage may be provided by an external voltage source 580, and may have a value in a range of about 30 V to about 60 V (e.g., about 48 V), although the drain bias voltage may be lower or higher, as well.

The silicon driver stage IC die 510 (e.g., silicon IC die 410, FIG. 4) is electrically coupled to the GaN final stage IC die 570 (e.g., GaN IC die 470, FIG. 4) through connection 523 between the output terminal 522 of the silicon IC die 510 and an input terminal 590 of the GaN IC die 570. For example, the connection 523 may include an inductive connection, such as a wirebond array (e.g., wirebond array 423, FIG. 4), or may include another type of connection (e.g., including a microstrip line, a printed coil, a parallel-coupled resistor/capacitor circuit, and so on). The connection 523 provides a non-integrated portion of the interstage impedance matching circuit 550. According to an embodiment, the connection 523 has an inductance value in a range of about 0.2 nH to about 0.3 nH (e.g., about 0.25 nH), although the inductance value may be smaller or larger, as well.

The GaN final stage IC die 570 includes a plurality of circuits integrated within a GAN IC die that is distinct from the silicon IC die. In an embodiment, the integrated circuitry of die 570 includes an input terminal 590 (e.g., input terminal 490, FIG. 4), an output terminal 592 (e.g., output terminal 492, FIG. 4), final stage gate bias circuit 565, a power transistor 572 (e.g., transistor 472, FIG. 4), and final stage drain bias circuit 562, in an embodiment.

The power transistor 572 is the primary amplification component of the GaN final stage IC die 570. In an embodiment, power transistor 572 includes a FET with a gate terminal 574 (control terminal), a drain terminal 576 (first current-conducting terminal), and a source terminal 578 (second current conducting terminal). The input terminal 590 is coupled to the gate terminal 574 of the GaN transistor 572. The drain terminal 576 of the GaN transistor 572 is coupled to the output terminal 592, and the source terminal 578 of the GaN transistor 572 is electrically coupled to a ground node 596 (e.g., the source terminal 578 is electrically coupled to a conductive layer on a bottom surface of the GaN IC die 570 through one or more TSVs). The output terminal 592 is electrically coupled through a connection 579 (e.g., a wirebond array or other electrical connection) to the RF signal output terminal 504 of the amplifier 500.

According to a specific embodiment, the power transistor 572 includes a GaN-based high electron mobility transistor (HEMT), which has a power density in a range of about 5.0 W/mm to about 15.0 W/mm (e.g., about 10.0 W/mm). Further, the power transistor 572 has an input impedance in a range of about 1.0 ohms to about 5.0 ohms (e.g., about 1.4 ohms), although the input impedance could be smaller or larger, as well.

According to an embodiment, the gate bias voltage, Vg2, for the power transistor 572 of the GaN final stage IC die 570 is provided through the final stage gate bias circuit 565 (e.g., circuit 465, FIG. 4), which includes an input terminal 594, resistor 566, inductor 567, and capacitor 568, in an embodiment. In alternate embodiments, the resistor 566 may be excluded, or the order of the resistor 566, the inductor 567, and the capacitor 568 may be different from the order depicted in FIG. 5.

During operation, a DC voltage may be provided by an external voltage source 582 through the input terminal 594, which is electrically coupled to a node of the bias circuit 565 (e.g., a node between inductor 567 and capacitor 568). The final stage gate bias voltage circuit 565 may convert the received voltage into a DC gate bias voltage, Vg2, for the GaN transistor 572. For example, the DC gate bias voltage for the final stage, Vg2, may have a negative value down to about −5.0 V or less (e.g., about −3.5 V), although the gate bias voltage may be lower or higher and/or positive, as well.

The drain bias voltage, Vd2, for the power transistor 572 is provided to the drain terminal 576 of the power transistor 572 through the final stage drain bias circuit 562 (e.g., circuit 462, FIG. 4), in an embodiment. The final stage drain bias circuit 562 includes an input terminal 594 and a series combination of an inductor 563 and a capacitor 564 (e.g., a DC blocking capacitor) electrically coupled between the drain terminal 576 of final stage transistor 572 and the ground node 596. More particularly, the drain bias voltage, Vg2, may be provided through an input terminal 578, which is electrically coupled to a node of the bias circuit 562 (e.g., a node between inductor 563 and the capacitor 564). In an alternate embodiment, and as indicated by the dashed line in FIG. 5, the drain bias voltage, Vg2, for the GaN power transistor 572 may be provided to the drain terminal 576 of the power transistor 572 through RF output terminal 592. As discussed in detail previously, and according to an embodiment, the final stage drain bias voltage may be provided by the same external voltage source 580 as is used to provide the driver stage drain bias voltage. Accordingly, the driver stage drain bias voltage and the final stage drain bias voltage may be equal (e.g., Vg1=Vg2=48 V or some other value).

The amplifiers 400, 500 depicted in FIGS. 4 and 5 each include a single amplification path. Other amplifier embodiments may include two or more amplification paths. For example, in some embodiments, multiple amplification paths may be electrically coupled together as part of a multiple-path amplifier system. For example, multiple instances of the amplifier embodiments described in conjunction with FIGS. 4 and 5 may be implemented in a Doherty power amplifier, or in another type of multiple-path amplifier. For example, a first instance of the amplifier embodiments described in conjunction with FIGS. 4 and 5 may be incorporated into a main amplification path of a Doherty power amplifier, and one or more additional instances of the amplifier embodiments may be incorporated into one or more peaking amplification paths.

Figure 6:
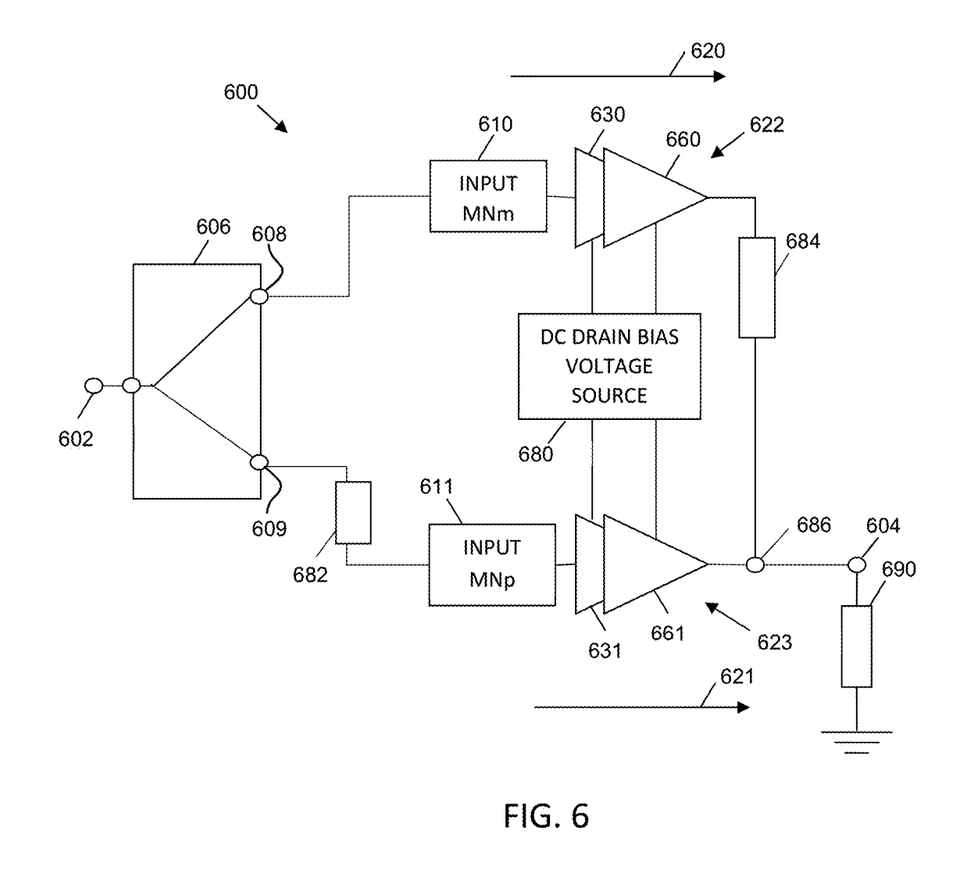
FIG. 6 is a simplified block diagram of a Doherty power amplifier that may be used in a transmitter lineup, in accordance with an embodiment.

For example, FIG. 6 is a simplified schematic diagram of a Doherty power amplifier 600, which may include one or more instances of RF amplifiers 400, 500. Doherty amplifier 600 includes an input node 602, an output node 604, a power divider 606 (or splitter), a main amplifier path 620 with a two-stage main amplifier 622 (including driver stage amplifier 630 and final stage amplifier 660), a peaking amplifier path 621 with a two-stage peaking amplifier 623 (including driver stage amplifier 631 and final stage amplifier 661), and a combining node 686. A load 690 may be coupled to the combining node 686 (e.g., through an impedance transformer, not shown) to receive an amplified RF signal from amplifier 600.

Power divider 606 is configured to divide the power of an input RF signal received at input node 602 into main and peaking portions of the input signal. The main input signal is provided to the main amplifier path 620 at power divider output 608, and the peaking input signal is provided to the peaking amplifier path 621 at power divider output 609. During operation in a full-power mode when both the main and peaking amplifier paths 620, 621 are supplying current to the load 690, the power divider 606 divides the input signal power between the amplifier paths 620, 621. For example, the power divider 606 may divide the power equally, such that roughly one half of the input signal power is provided to each path 620, 621 (e.g., for a symmetric Doherty amplifier configuration). Alternatively, the power divider 606 may divide the power unequally (e.g., for an asymmetric Doherty amplifier configuration). Essentially, the power divider 606 divides an input RF signal supplied at the input node 602, and the divided signals are separately amplified along the main and peaking amplifier paths 620, 621. The amplified signals are then combined in phase at the combining node 686.

The amplifier 600 is designed so that phase coherency between the main and peaking amplifier paths 620, 621 is maintained across a frequency band of interest to ensure that the amplified main and peaking signals arrive in phase at the combining node 686, and thus to ensure proper Doherty amplifier operation. More specifically, Doherty amplifier 600 has a "non-inverted" load network configuration. In the non-inverted configuration, the input circuit is configured so that an input signal supplied to the peaking amplifier path 621 is delayed by 90 degrees with respect to the input signal supplied to the main amplifier path 620 at the center frequency of operation, f0, of the amplifier 600. To ensure that the main and peaking input RF signals are supplied to the main and peaking amplifier paths 620, 621 with about 90 degrees of phase difference, as is fundamental to proper Doherty amplifier operation, phase delay element 682 applies about 90 degrees of phase delay to the peaking input signal (i.e., the signal produced at power divider output 609). For example, phase delay element 682 may include a quarter wave transmission line, or another suitable type of delay element with an electrical length of about 90 degrees.

The 90 degree phase delay difference at the inputs to the main and peaking amplifier paths 620, 621 is applied to compensate for a 90 degree phase delay applied to the signal between the output of main amplifier 622 and the combining node 686. This is achieved through an additional delay element 684 between the output of the main amplifier 622 and the combining node 686. The additional delay element 684 also may be configured to perform an impedance inversion, and therefore element 684 may be referred to as a "phase delay and impedance inversion" element or structure.

Each of the main amplifier path 620 and the peaking amplifier path 621 includes an input impedance matching network 610, 611 (input MNm and input MNp) and a multiple-stage power amplifier 622, 623 (e.g., an instance of amplifier 400, 500, FIGS. 4, 5). The input impedance matching networks 610, 611 may be implemented between the power divider outputs 608, 609 and the inputs of the main and peaking amplifiers 622, 623 (e.g., the gates of the main and peaking driver stage amplifiers 630, 632). In each case, the matching networks 610, 611, may be used to incrementally increase the circuit impedance toward the load impedance and source impedance. All or portions of the input impedance matching networks 610, 611 may be integrally formed with the main and/or peaking amplifiers 622, 623. For example, as is the case with input impedance matching network 430, 530 (FIGS. 4, 5), all or a portion of the input impedance matching network 610 may be integrally formed with the IC corresponding to the main amplifier 622, and all or a portion of the input impedance matching network 611 may be integrally formed with the IC corresponding to the peaking amplifier 623. Alternatively, all or portions of the input impedance matching networks 610, 611 may be implemented on a PCB or other substrate to which the IC is mounted.

The multiple-stage power amplifiers 622, 623 (e.g., two instances of amplifiers 400, 500, FIGS. 4, 5) are configured to amplify RF signals conducted through the main and peaking amplifier paths 620, 621. According to various embodiments, the main and peaking driver stage amplifiers 630, 632 each may be implemented, for example, using a field effect transistor (e.g., two instances of FET 440, 540, FIGS. 4, 5), and the main and peaking final stage amplifiers 660, 661 each may be implemented, for example, using another field effect transistor (e.g., two instances of FET 472, 572, FIGS. 4, 5). As discussed in detail above, the outputs of the FETs corresponding to each driver stage amplifier 630, 631 and each final stage amplifier 660, 661 are configured to operate with the same output bias voltage (e.g., drain bias voltage). The output bias voltages may be provided, for example, by a single DC drain bias voltage source 680 (e.g., DC drain bias voltage source 180, 280, 480, 580, FIGS. 1, 2, 4, 5).

During operation of Doherty amplifier 600, the main amplifier 622 is biased to operate in class AB mode, and the peaking amplifier 623 is biased to operate in class C mode. At low power levels, where the power of the input signal at node 602 is lower than the turn-on threshold level of peaking amplifier 623, the amplifier 600 operates in a low-power (or back-off) mode in which the main amplifier 622 is the only amplifier supplying current to the load 690. When the power of the input signal exceeds a threshold level of the peaking amplifier 623, the amplifier 600 operates in a high-power mode in which the main amplifier 622 and the peaking amplifier 623 both supply current to the load 690. At this point, the peaking amplifier 623 provides active load modulation at combining node 686, allowing the current of the main amplifier 622 to continue to increase linearly.

As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A multiple-stage amplifier comprising:
a driver stage transistor with a first gate terminal and a first drain terminal, wherein the driver stage transistor is characterized by a first power density;
a first drain bias circuit coupled to the first drain terminal of the driver stage transistor, and configured to provide a first drain bias voltage to the first drain terminal;
a final stage transistor with a second gate terminal and a second drain terminal, wherein the final stage transistor is characterized by a second power density that is larger than the first power density;
a second drain bias circuit coupled to the second drain terminal of the final stage transistor, and configured to provide a second drain bias voltage to the second drain terminal, wherein the amplifier is configured such that the second drain bias voltage equals the first drain bias voltage; and
an interstage impedance matching circuit coupled between the first drain terminal and the second gate terminal.

2. The amplifier of claim 1, wherein a ratio of the first power density of the driver stage transistor to the second power density of the final stage transistor is in a range of 1:2 to 1:8.

3. The amplifier of claim 1, wherein:
the driver stage transistor a silicon-based semiconductor field effect transistor; and
the final stage transistor a III-V-based semiconductor field effect transistor.

4. The amplifier of claim 3, wherein:
the driver stage transistor is a laterally-diffused metal oxide semiconductor field effect transistor, and the first power density is in a range of about 1.0 watts/millimeter (W/mm) to about 3.0 W/mm; and
the final stage transistor is a gallium nitride based high electron mobility transistor, and the second power density is in a range of about 5.0 W/mm to about 15.0 W/mm.

5. The amplifier of claim 1, wherein the first and second drain bias voltages are in a range of 30 volts to 60 volts.

6. The amplifier of claim 1, wherein:
the driver stage transistor and the first drain bias circuit are integrally formed in a first semiconductor die;
the final stage transistor is integrally formed in a second semiconductor die; and
the interstage impedance matching circuit includes a connector between the first and second semiconductor dies.

7. The amplifier of claim 6, further comprising:
a final stage gate bias circuit that is coupled to the second gate terminal and integrally formed in the second semiconductor die; and
a decoupling capacitor coupled between the first drain bias circuit and the final stage gate bias circuit.

8. A Doherty power amplifier comprising:
a first amplification path that includes
a first driver stage transistor with a first gate terminal and a first drain terminal, wherein the first driver stage transistor is characterized by a first power density,
a first drain bias circuit coupled to the first drain terminal of the first driver stage transistor, and configured to provide a first drain bias voltage to the first drain terminal,
a first final stage transistor with a second gate terminal and a second drain terminal, wherein the first final stage transistor is characterized by a second power density that is larger than the first power density, and
a second drain bias circuit coupled to the second drain terminal of the first final stage transistor, and configured to provide a second drain bias voltage to the second drain terminal; and
a second amplification path that includes
a second driver stage transistor with a third gate terminal and a third drain terminal, wherein the third driver stage transistor is characterized by the first power density,
a third drain bias circuit coupled to the third drain terminal of the second driver stage transistor, and configured to provide a third drain bias voltage to the third drain terminal,
a second final stage transistor with a fourth gate terminal and a fourth drain terminal, wherein the second final stage transistor is characterized by the second power density, and
a fourth drain bias circuit coupled to the fourth drain terminal of the second final stage transistor, and configured to provide a fourth drain bias voltage to the fourth drain terminal, wherein the Doherty power amplifier is configured such that the first, second, third, and fourth drain bias voltages are equal.

9. The Doherty power amplifier of claim 8, wherein a ratio of the first power density to the second power density is in a range of 1:2 to 1:8.

10. The Doherty power amplifier of claim 8, wherein:
the first and second driver stage transistors are silicon-based semiconductor field effect transistors; and
the first and second final stage transistors are III-V-based semiconductor field effect transistors.

11. The Doherty power amplifier of claim 8, further comprising:
a power splitter with an input terminal and first and second output terminals, wherein the first output terminal is electrically coupled to the first gate terminal, the second output terminal is electrically coupled to the third gate terminal, and the power splitter is configured to receive an input RF signal at the input terminal of the power splitter, and to split power of the input RF signal into first and second RF signals that are produced at the first and second output terminals of the power splitter.

12. A transceiver array comprising:
a transceiver array substrate;
a first transceiver coupled to the transceiver array substrate and having a first multiple-stage amplifier with a first driver stage transistor with a first drain terminal, a first final stage transistor with a second drain terminal, and first bias circuitry coupled to the first and second drain terminals;
a second transceiver coupled to the transceiver array substrate and having a second multiple-stage amplifier with a second driver stage transistor with a third drain terminal, a second final stage transistor with a fourth drain terminal, and second bias circuitry coupled to the third and fourth drain terminals; and
a network of interconnected bias supply lines coupled to the transceiver array substrate, and electrically connected to the first and second bias circuitry and configured such that a single drain bias voltage is provided to the first, second, third, and fourth drain terminal.

13. The transceiver array of claim 12, further comprising:
a DC drain bias voltage source coupled to the network of interconnected bias supply lines, and configured to provide the single drain bias voltage.

14. The transceiver array of claim 12, wherein:
the first multiple-stage amplifier forms a portion of a first Doherty power amplifier; and
the second multiple-stage amplifier forms a portion of a second Doherty power amplifier.

15. The transceiver array of claim 12, wherein:
the first and second driver stage transistors are characterized by a first power density; and
the first and second final stage transistors are characterized by a second power density that is larger than the first power density.

16. The transceiver array of claim 15, wherein a ratio of the first power density to the second power density is in a range of 1:2 to 1:8.

17. The transceiver array of claim 15, wherein:
the first and second driver stage transistors are laterally-diffused metal oxide semiconductor field effect transistors, and the first power density is in a range of about 1.0 watts/millimeter (W/mm) to about 3.0 W/mm; and
the first and second final stage transistors are gallium nitride based high electron mobility transistors, and the second power density is in a range of about 5.0 W/mm to about 15.0 W/mm.

18. The transceiver array of claim 12, wherein:
the first and second driver stage transistors are silicon-based semiconductor field effect transistors; and
the first and second final stage transistors are III-V-based semiconductor field effect transistors.

19. The amplifier of claim 1, wherein the first drain terminal and the second drain terminal are electrically coupled, respectively, to a single voltage supply input terminal via the first drain bias circuit and the second drain bias circuit.

20. The Doherty power amplifier of claim 8, wherein the first, second, third, and fourth drain terminals are electrically coupled, respectively, to a single voltage supply input terminal via the first, second, third, and fourth drain bias circuits.

21. A multiple-stage amplifier comprising:
a driver stage transistor integrally formed in a first semiconductor die having a first gate terminal and a first drain terminal, wherein the driver stage transistor is characterized by a first power density;
a first drain bias circuit integrally formed in the first semiconductor die coupled to the first drain terminal of the driver stage transistor and configured to provide a first drain bias voltage to the first drain terminal;
a final stage transistor integrally formed in a second semiconductor die having a second gate terminal and a second drain terminal, wherein the final stage transistor is characterized by a second power density that is larger than the first power density;
a second drain bias circuit coupled to the second drain terminal of the final stage transistor, and configured to provide a second drain bias voltage to the second drain terminal, wherein the second drain bias voltage equals the first drain bias voltage; and
an interstage impedance matching circuit coupled between the first drain terminal and the second gate terminal, the interstage impedance matching circuit including a connector between the first and second semiconductor dies.

22. The amplifier of claim 21, further comprising:
a final stage gate bias circuit that is coupled to the second gate terminal and is integrally formed in the second semiconductor die; and
a decoupling capacitor coupled between the first drain bias circuit and the final stage gate bias circuit.

* * * * *